US007936196B2

(12) United States Patent
Kim et al.

(10) Patent No.: US 7,936,196 B2
(45) Date of Patent: May 3, 2011

(54) FIRST DELAY LOCKING METHOD, DELAY-LOCKED LOOP, AND SEMICONDUCTOR MEMORY DEVICE INCLUDING THE SAME

(75) Inventors: Jun Bae Kim, Seoul (KR); Chang-Hyun Bae, Hwasung-si (KR); Jung-Bae Lee, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/716,373

(22) Filed: Mar. 3, 2010

(65) Prior Publication Data
US 2010/0226188 A1  Sep. 9, 2010

(30) Foreign Application Priority Data

Mar. 3, 2009 (KR) .................. 10-2009-0018098

(51) Int. Cl.
*H03L 7/06* (2006.01)
(52) U.S. Cl. ........................................ 327/158; 327/149
(58) Field of Classification Search .................. 327/149, 327/158
See application file for complete search history.

(56) References Cited

U.S. PATENT DOCUMENTS

| 7,161,397 B2 * | 1/2007 | Lee et al. ........................ 327/149 |
| 7,184,509 B2 * | 2/2007 | Cho et al. ........................ 375/373 |
| 7,202,719 B2 * | 4/2007 | Gabato et al. .................. 327/158 |
| 7,327,176 B2 * | 2/2008 | Takai et al. ...................... 327/158 |
| 7,567,103 B2 * | 7/2009 | Park et al. ...................... 327/158 |
| 7,642,826 B2 * | 1/2010 | Takai ............................. 327/158 |
| 7,737,744 B2 * | 6/2010 | Choi .............................. 327/158 |
| 7,812,654 B2 * | 10/2010 | Kim et al. ...................... 327/158 |
| 7,830,189 B2 * | 11/2010 | Abe ............................... 327/158 |
| 7,839,191 B2 * | 11/2010 | Takai ............................. 327/158 |
| 2005/0024107 A1 * | 2/2005 | Takai et al. ...................... 327/158 |
| 2007/0279113 A1 * | 12/2007 | Maeda et al. ................... 327/158 |
| 2008/0054964 A1 * | 3/2008 | Lee et al. ........................ 327/158 |
| 2008/0100356 A1 * | 5/2008 | Lee ................................ 327/158 |
| 2010/0102860 A1 * | 4/2010 | Kim ............................... 327/158 |
| 2010/0182058 A1 * | 7/2010 | Gomm ........................... 327/158 |
| 2010/0226188 A1 * | 9/2010 | Kim et al. ...................... 365/194 |

FOREIGN PATENT DOCUMENTS

| EP | 1139569 A1 * | 10/2001 |
| JP | 11355134 | 12/1999 |
| JP | 2008059741 | 3/2008 |
| KR | 100673135 B1 | 1/2007 |
| KR | 1020080020275 | 3/2008 |

* cited by examiner

*Primary Examiner* — Lincoln Donovan
*Assistant Examiner* — Adam D Houston
(74) *Attorney, Agent, or Firm* — Muir Patent Consulting, PLLC

(57) ABSTRACT

According to one embodiment, a method of performing fast locking in a delay locked loop circuit is disclosed. The method includes performing a first comparison comparing an input clock signal to a first feedback clock signal that is a non-inverted feedback clock signal, and performing a second comparison comparing the input clock signal to a second feedback clock signal that is the feedback clock signal inverted. The method also includes, based on the first and second comparisons, selecting one of the non-inverted feedback clock signal or the inverted feedback clock signal to synchronize with the input clock signal. In addition, the method includes synchronizing the selected clock signal with the input clock signal.

23 Claims, 17 Drawing Sheets

FIRST DELAY LOCKING METHOD, DELAY-LOCKED LOOP, AND SEMICONDUCTOR MEMORY DEVICE INCLUDING THE SAME

CROSS-REFERENCE TO RELATED APPLICATIONS

This application claims priority to Korean Patent Application No. 10-2009-0018098 filed on Mar. 3, 2009, in the Korean Intellectual Property Office, the disclosure of which is incorporated herein by reference.

BACKGROUND

The disclosed embodiments relate to a delay-locked loop (DLL) and a semiconductor memory device including the same, and more particularly, to a method for achieving fast locking regardless of a duty error window, and a semiconductor memory device including the same.

With the increase of operating speed of semiconductor memory devices, devices for synchronizing signal timing are often used to efficiently transfer data between a semiconductor memory device and a memory controller. Examples of the devices are a phase-locked loop (PLL) and a DLL.

The PLL generates a voltage-controlled signal according to a phase difference between a received clock signal and a reproduction clock signal and changes the frequency of the reproduction clock signal in response to the voltage-controlled signal, thereby controlling the phase of the reproduction clock signal to follow the phase of the received clock signal. The DLL generates a voltage-controlled signal according to a phase difference between a received clock signal and a reproduction clock signal and changes the amount of delay for the reproduction clock signal in response to the voltage-controlled signal, thereby controlling the phase of the reproduction clock signal to follow the phase of the received clock signal.

The DLL is usually used in the field of digital signal processing or synchronous dynamic random access memory (SDRAM) devices. An example of a typical DLL including, among other things, a phase detector, a delay line, and delay control signals, can be seen in U.S. Pat. No. 7,184,509, which is incorporated herein by reference in its entirety. At the initial stage of operation, one type of DLL uses an inversion scheme to achieve fast locking. In the inversion scheme, whether to invert a reproduction clock signal is determined based on the phase difference between a received clock signal and the reproduction clock signal and then an inverted or non-inverted reproduction clock signal is output. When the phase difference between the received and the reproduction clock signals is at least one-half cycle, the non-inverted reproduction clock signal is output. When the phase difference is less than one-half cycle, the inverted reproduction clock signal is output. Accordingly, following time, i.e., delay time is shorter than one-half cycle. When a duty ratio of the reproduction clock signal changes, however, initial locking may be delayed.

FIGS. 1A through 1C are diagrams for explaining the inversion scheme used in the DLL. Referring to FIG. 1A, a phase difference τ1 between a received clock signal EXCLK and a reproduction clock signal RCLK is at least one-half cycle, i.e., $\tau 1 \geq T/2$. Thus, the DLL outputs a non-inverted reproduction clock signal, that is, the reproduction clock signal RCLK is synchronized with EXCLK as it is without being inverted.

Referring to FIG. 1B, a phase difference τ2 between the received clock signal EXCLK and the reproduction clock signal RCLK is less than one-half cycle, i.e., $\tau 2 < T/2$. Therefore, the DLL produces an inverted reproduction clock signal RCLKB, that is, the reproduction clock signal RCLK is inverted and then synchronized with EXCLK.

Referring to FIG. 1C, in some situations, a reproduction clock signal ERCLK may have a duty ratio of greater or less than 50% (e.g., 40%, 45%, 55%, 60%). In some instances, if the phase of the ERCLK signal for locking purposes is determined based on the rising edge of the signal, a typical inversion fast locking DLL might cause the delay associated with locking to be longer than had the inversion fast locking DLL not been used. For example, as shown in FIG. 1C, a situation may occur where a rising edge of ERCLK occurs in the first half of the EXCLK cycle, such that the DLL inverts the ERCLK signal (as shown by ERCLKB) and uses that signal for locking. However, as shown in FIG. 1C, the delay associated with locking in that case (shown by arrow "1") is actually longer than the delay that would have occurred for locking had the ERCLK signal not been inverted (shown by arrow "2"). Accordingly, initial locking is delayed more than is necessary, thereby decreasing operating speed.

To overcome this problem, a method of using a duty error window for a duty error in a received clock signal when determining whether to perform inversion has been introduced. However, the method is still inconvenient because the width of the duty error window needs to be changed according to the frequency of the received clock signal.

SUMMARY

Some exemplary embodiments provide a method for achieving fast locking in a DLL regardless of an error window, and a DLL and semiconductor memory device for performing the same.

According to one embodiment, a method of performing fast locking in a delay locked loop circuit is disclosed. The method includes performing a first comparison comparing an input clock signal to a first feedback clock signal that is a non-inverted feedback clock signal, and performing a second comparison comparing the input clock signal to a second feedback clock signal that is the feedback clock signal inverted. The method also includes, based on the first and second comparisons, selecting one of the non-inverted feedback clock signal or the inverted feedback clock signal to synchronize with the input clock signal. In addition, the method includes synchronizing the selected clock signal with the input clock signal.

According to another embodiment, a method of synchronizing an external clock signal with a clock signal used for a circuit element is disclosed. The method includes creating a reproduction clock signal, and creating an inverted reproduction clock signal that is an inversion of the reproduction clock signal. The method further includes performing coarse locking for the reproduction clock signal during a first period of time, and performing coarse locking for the inverted reproduction clock signal during the first period of time. The method additionally includes determining whether to perform fine locking on the reproduction clock signal or the inverted reproduction clock signal, and based on the determining, selecting one of the reproduction clock signal and the inverted reproduction clock signal for which to perform fine locking. The method also includes performing fine locking on the selected clock signal during a second period of time until the selected clock signal is synchronized with the external clock signal.

According to another embodiment, a delay-locked loop is disclosed. The delay-locked loop includes a variable delay line configured to delay an input clock signal and output a delayed clock signal in response to a delay control signal, a replica circuit that receives the delayed clock signal and outputs a reproduction clock signal, a first phase detector configured to compare a phase of the reproduction clock signal with the phase of the input clock signal, and output a first phase difference detection signal, and a second phase detector configured to compare a phase of an inverted reproduction clock signal, obtained by inverting the reproduction clock signal, with the phase of the input clock signal, and output a second phase difference detection signal. The delay-locked loop additionally includes an inversion controller configured to output an inversion control signal deciding inversion or non-inversion of the delayed clock signal based on the first and second phase difference detection signals, and an inversion unit configured to selectively output the delayed clock signal or the inverted delayed clock signal based on the inversion control signal.

BRIEF DESCRIPTION OF THE DRAWINGS

The above and other features and advantages of the disclosure will become more apparent by describing in detail exemplary embodiments thereof with reference to the attached drawings in which:

FIG. 3 is an exemplary schematic block diagram of a first phase detector illustrated in FIG. 2a;

DETAILED DESCRIPTION

Figure 1A:
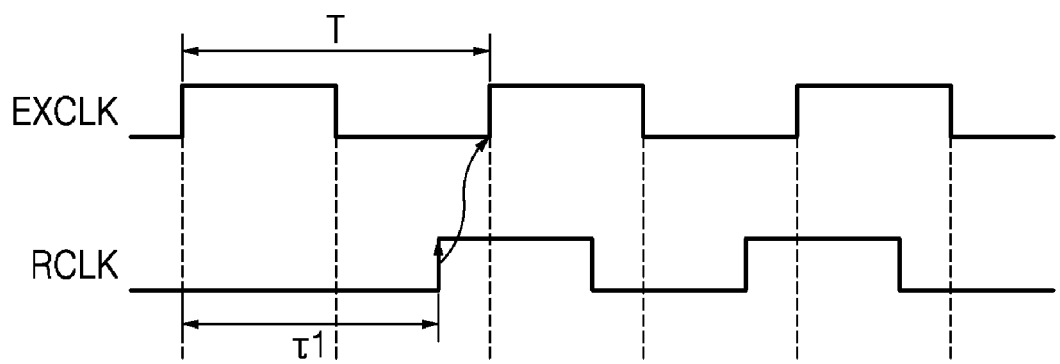
FIGS. 1A through 1C are timing diagrams for explaining an inversion scheme used in a conventional delay-locked loop (DLL)
Figure 1B:
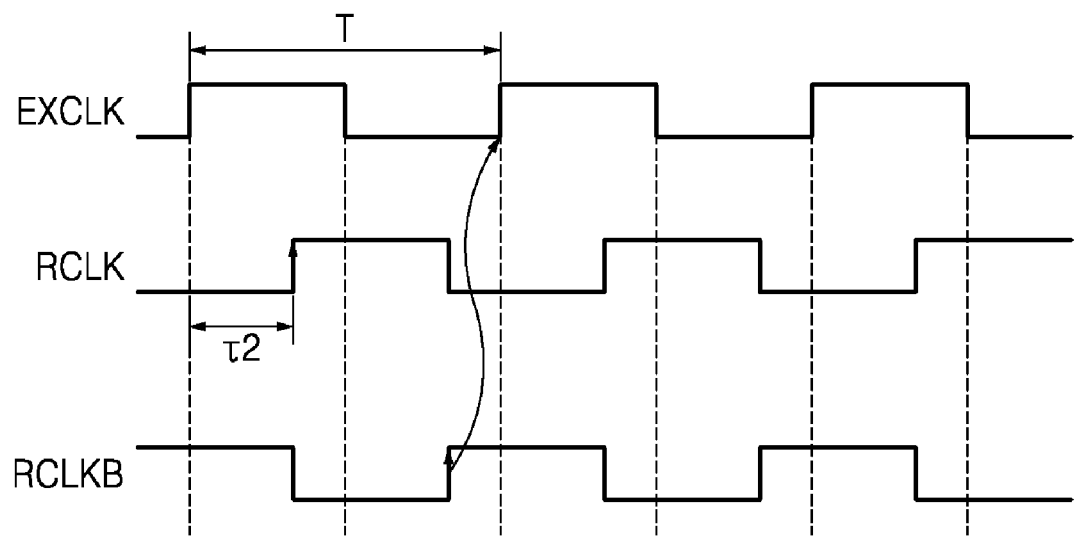
Figure 1C:
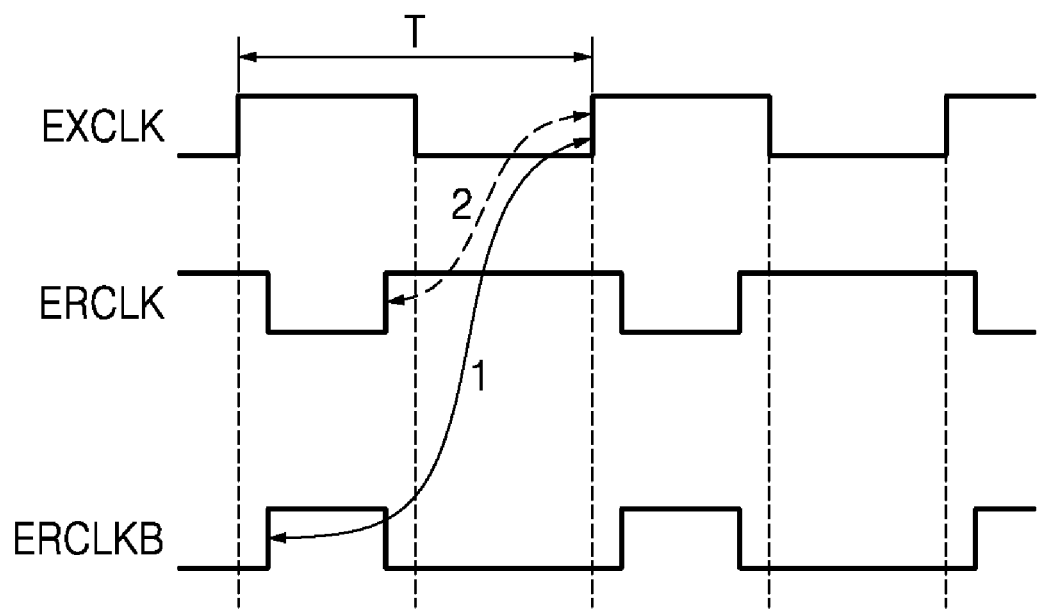

This application now will be described more fully with reference to the accompanying drawings, in which various embodiments are shown. The disclosed embodiments may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
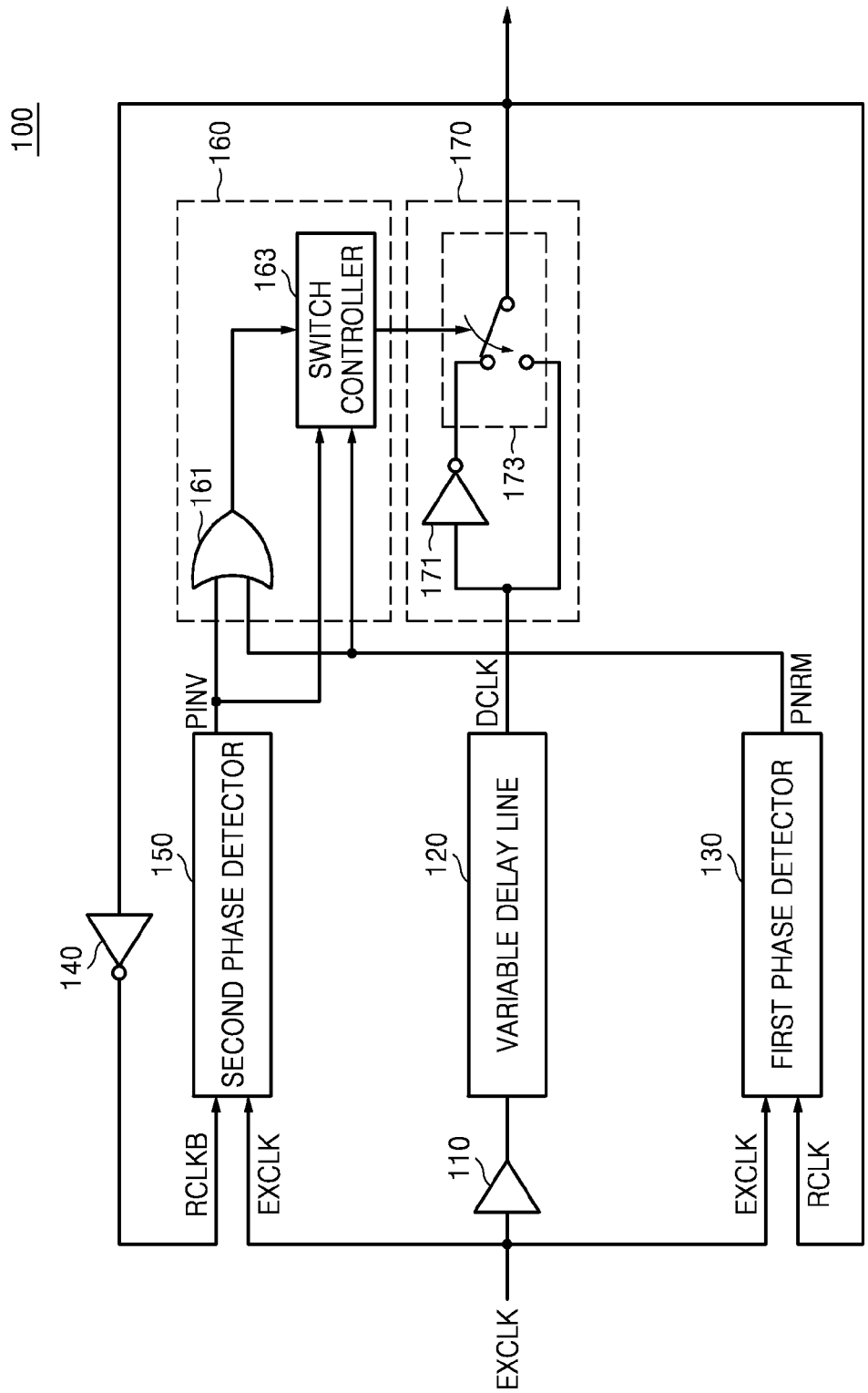
FIG. 2 is a schematic block diagram of a DLL according to one exemplary embodiment.

FIG. 2 is a schematic block diagram of a delay-locked loop (DLL) 100 according to an exemplary embodiment. The DLL 100 includes an input buffer 110, a variable delay line 120, a first phase detector 130, an inverter 140, a second phase detector 150, an inversion controller 160, and an inversion unit 170. Although not shown, DLL 100 may include additional circuit elements typical of DLL circuits, such as one or more replica circuits connected between an output of variable delay line 120 and an input to first or second phase detector 130 or 150, and one or more control circuits for controlling variable delay line 120 based on outputs from first phase detector 130 and/or second phase detector 150.

The input buffer 110 receives and buffers an external or a received clock signal EXCLK. The variable delay line 120 generates a delayed clock signal, which after passing through a replica circuit (not shown) becomes reproduction clock signal RCLK, following the phase of the received clock signal EXCLK in response to a delay control signal. For this operation, the variable delay line 120 may include a plurality of unit delay cells; a multiplexer (MUX) which selects two adjacent clock signals from among clock signals output from the unit delay cells and having different delay characteristics; and an interpolator which interpolates the two clock signals selected by the MUX.

The first phase detector 130 detects a phase difference between the reproduction clock signal RCLK and the received clock signal EXCLK and outputs a first phase difference detection signal PNRM. In detail, the first phase detector 130 determines whether a rising edge of the received clock signal EXCLK occurs in a delay period, described further below as a "time window" of the reproduction clock signal RCLK. The structure and the operation of the first phase detector 130 will be described in detail with reference to FIG. 3 later.

The inverter 140 inverts the delayed clock signal output from variable delay line 120 (and having passed through a replica circuit) and outputs an inverted reproduction clock signal RCLKB. The second phase detector 150 detects a phase difference between the inverted reproduction clock signal RCLKB and the received clock signal EXCLK and outputs a second phase difference detection signal PINV. In detail, the second phase detector 150 determines whether a rising edge of the received clock signal EXCLK occurs in a delay period, described further below as a "time window" of the inverted reproduction clock signal RCLKB. The structure and the operation of the second phase detector 150 are similar to those of the first phase detector 130.

The inversion controller 160 determines whether to invert the received clock signal EXCLK based on the first and second phase difference detection signals PNRM and PINV. In detail, the inversion controller 160 detects during which delay period—that of the reproduction clock signal RCLK or that of the inverted reproduction clock signal RCLKB—a rising edge of the received clock signal EXCLK occurs first, and determines whether to invert the delayed clock signal output from variable delay line 120 (referred to as a received delayed clock signal EXCLK) based on a detection result. For instance, when a rising edge of the received clock signal EXCLK occurs in the delay period of the reproduction clock signal RCLK prior to occurring in the delay period of the inverted reproduction clock signal RCLKB, the inversion controller 160 determines not to invert the received delayed clock signal EXCLK. When a rising edge of the received clock signal EXCLK occurs in the delay period of the inverted reproduction clock signal RCLKB prior to occurring in the reproduction clock signal RCLK, the inversion controller 160 determines to invert the received delayed clock signal EXCLK.

For this operation, the inversion controller 160 includes a logic circuit 161 which outputs a coarse locking end signal based on a combination of the first phase difference detection signal PNRM and the second phase difference detection signal PINV, and a switch controller 163 which outputs a switch control signal determining whether to invert the received delayed clock signal EXCLK based on the first and second phase difference detection signals PNRM and PINV in response to the coarse locking end signal from the logic circuit 161. Although logic circuit 161 and switch controller 163 are depicted as separate elements, they may be combined into one element or into other elements of DLL 100, or one or more of them may not be needed to implement the functions described herein. In one embodiment, the logic circuit 161 is implemented by an OR gate and outputs a logic high when either of the first and second phase difference detection signals PNRM and PINV is at a logic high to determine the end of coarse locking. Upon receiving the coarse locking end signal, the switch controller 163 outputs the switch control signal based on the state of the first phase difference detection signal PNRM from the first phase detector 130 or the second phase difference detection signal PINV from the second phase detector 150. In one embodiment, for example, when the first phase difference detection signal PNRM is at a high state, the switch controller 163 controls an output signal of the variable delay line 120 to be output as it is. When the second phase difference detection signal PINV is at a high state, the switch controller 163 controls the output signal of the variable delay line 120 to be inverted before being output.

The inversion unit 170 selectively outputs the received delayed clock signal EXCLK or the inverted received delayed clock signal EXCLK based on the switch control signal from the switch controller 163. The inversion unit 170 includes an inverter 171 inverting the output signal of the variable delay line 120 and a switch 173 selecting an output signal of the inverter 171 or the output signal of the variable delay line 120.

Figure 2A:
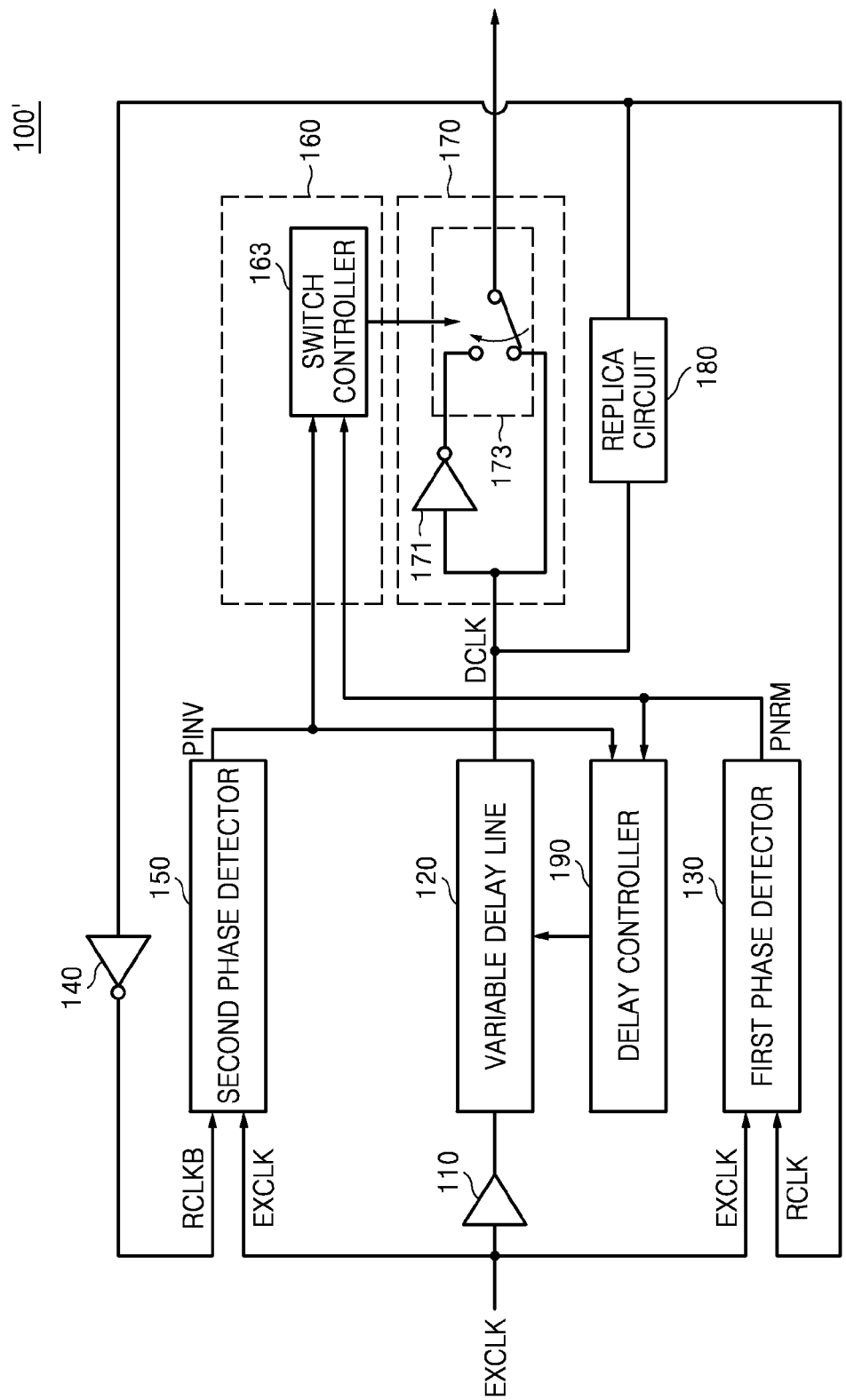
FIG. 2a is a schematic block diagram of a DLL according to another exemplary embodiment.

FIG. 2a is a schematic block diagram of a delay-locked loop (DLL) 100' according to one exemplary embodiment. FIG. 2a includes many of the same elements as FIG. 2 (labeled with the same numbers as in FIG. 2), but also describes additional elements according to one embodiment. The DLL 100' includes an input buffer 110, a variable delay line 120, a first phase detector 130, an inverter 140, a second phase detector 150, an inversion controller 160, an inversion unit 170, replica circuit 180, and a delay controller 190.

The input buffer 110 receives and buffers an external or a received clock signal EXCLK (collectively referred to herein as an input clock signal). The variable delay line 120 generates a delayed clock signal DCLK following behind the phase of the received clock signal EXCLK in response to a delay control signal. For this operation, the variable delay line 120 may include a plurality of unit delay cells; a multiplexer (MUX) which selects two adjacent clock signals from among clock signals output from the unit delay cells and having different delay characteristics; and an interpolator which interpolates the two clock signals selected by the MUX.

The delayed clock signal DCLK passes through inversion unit 170, which is initially set such that the signal DCLK passes directly through the inversion unit 170 without being inverted. The signal DCLK also passes through replica circuit 180, which replicates the delay associated with the circuitry through which the signal passes before reaching its final destination (e.g., an output buffer).

Following along the bottom portion of the DLL 100', the output from the replica circuit 180 is a reproduction clock signal RCLK that is fed back into phase detector 130. In one embodiment, the first phase detector 130 detects a phase difference between the reproduction clock signal RCLK and the received clock signal EXCLK and outputs a signal (PNRM) based on the detection. In one embodiment, the PNRM signal is either a logical 1 or 0, and the signal is sent to delay controller 190 and serves, along with PINV (discussed below) as a coarse locking end signal and/or a delay control signal. In one embodiment, upon initiation of the DLL 100', PNRM is initially set to 0. Subsequently, based on the EXCLK and RCLK signals input to first phase detector 130, first phase detector 130 determines whether a rising edge of the received clock signal EXCLK occurs during a window of time within a cycle of the reproduction clock signal RCLK. In one embodiment, the window of time may be a set period of time after a rising edge of RCLK, and when the rising edge of the received clock signal EXCLK occurs during the window of time, PNRM is set to logical 1. A further discussion of the window of time and the structure and the operation of the first phase detector 130 will be described in detail with reference to FIG. 3 later.

Following along the top portion of the DLL 100', the output from the replica circuit 180 passes through inverter 140 where it is inverted, and is output as an inverted reproduction clock signal RCLKB that is fed back into phase detector 150. In one embodiment, the second phase detector 150 detects a phase difference between the inverted reproduction clock signal RCLKB and the received clock signal EXCLK and outputs a signal (PINV) based on the detection. In one embodiment, PINV is either a logical 1 or 0, and the signal is sent to delay controller 190 and serves, along with PNRM as a coarse locking end signal and/or a delay control signal. Upon initiation of the DLL 100', PINV may initially be set to 0. Subsequently, based on the EXCLK and RCLKB signals input to second phase detector 150, second phase detector 150 determines whether a rising edge of the received clock signal EXCLK occurs during a window of time within a cycle of the inverted reproduction clock signal RCLKB. In one embodiment, similar to first phase detector 130, the window of time may be a set period of time after a rising edge of RCLKB, and when the rising edge of the received clock signal EXCLK occurs during the window of time, PINV is set to logical 1.

The signals PINV and PNRM may be used to control both the coarse locking and fine locking functions of variable delay line 120, and thus may be used to instruct variable delay line 120 how much to delay the EXCLK signal. For example, when PINV and PNRM are initially set to 0, delay controller 190 may instruct variable delay line 120 to perform coarse locking. However, in one embodiment, after one of the signals (PINV or PNRM) changes to 1, the signal serves as a coarse locking end signal, and causes delay controller 190 to instruct variable delay line 120 to end coarse locking and to begin fine locking. Then, in one embodiment, after that signal changes back to 0 (i.e., after the time window, discussed further below, ends), the EXCLK signal and either RCLKB (if PINV was the coarse locking end signal) or RCLK (if PNRM was the coarse locking end signal) are determined to be in phase, and the delay is locked. The control method disclosed above is exemplary only—other methods may be used or instructions may be sent from first phase detector 130 and/or second phase detector 150 to control the locking functions and delay amounts of variable delay line 120. In addition, although delay controller 190 is shown as separate from variable delay line 120, it can alternatively be considered to be part of variable delay line 120.

The inputs RCLK and RCLKB fed into the phase detectors 130 and 150 are collectively referred to herein as output clock signals, as they represent the signals (either a non-inverted signal or an inverted signal) that are synchronized with the EXCLK signal and are output to particular elements of a memory device or other product.

Based on the output (PINV and PNRM) from the first phase detector 130 and second phase detector 150, the inversion controller 160 and inversion unit 170 control whether the DCLK signal should be inverted or not. For example, in one embodiment, when PINV is 1, the switch controller 163 causes switch 173 to connect to the inverter 171, and when PNRM is 1, the switch controller 163 causes switch 173 to connect (or remain connected) directly to variable delay line 120. In addition, in one embodiment, inversion controller 160 and inversion unit 170 are set so that switch 173 only switches, if at all, one time.

An example of the operation of inversion controller 160 will now be described in connection with FIGS. 2b-2d, which depict exemplary timing diagrams.

Figure 2B:
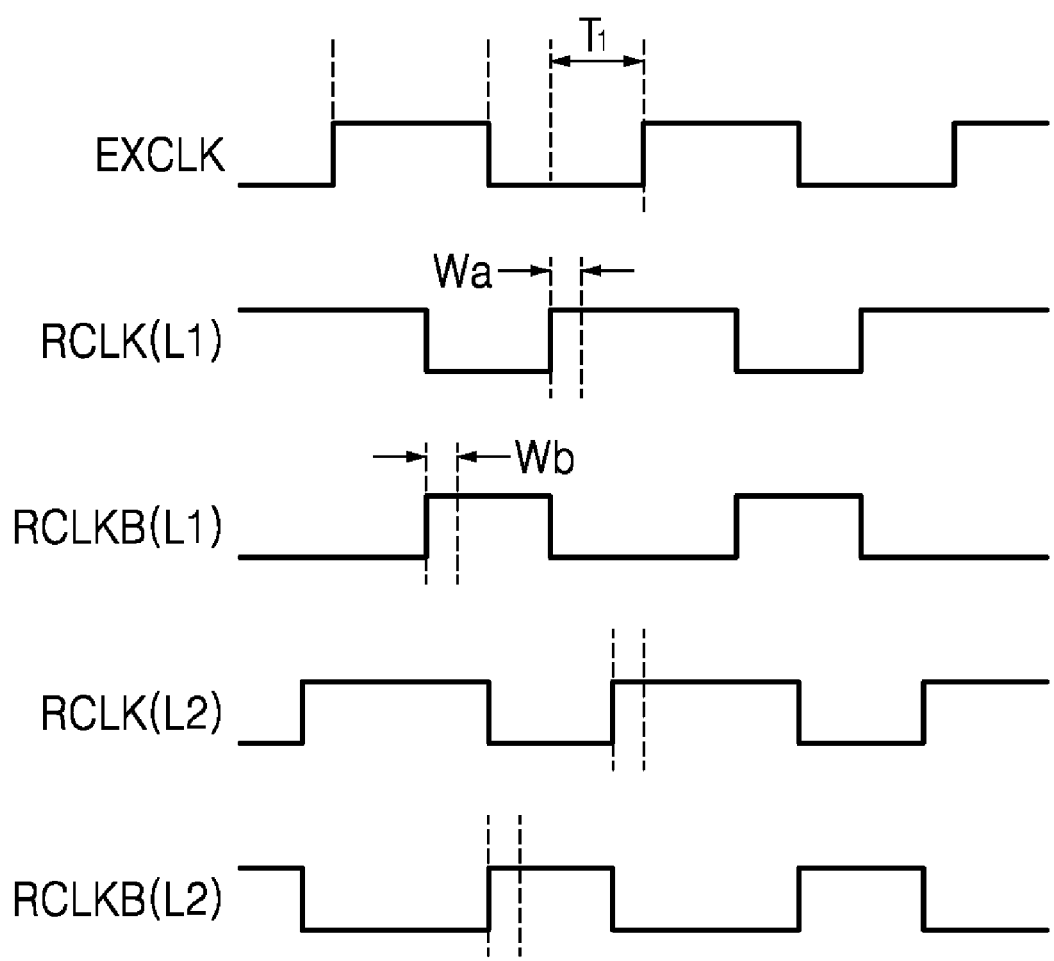
FIGS. 2b-2d are exemplary timing diagrams according to one or more exemplary embodiments.

FIG. 2b depicts an exemplary timing diagram for a situation where RCLK has a duty error, and where the RCLK during the initial loop of DLL 100' (RCLK(L1)) has a rising edge that falls in the second half of the cycle of EXCLK. As described previously, for a conventional fast locking DLL circuit using inversion, in the situation shown in FIG. 2b, the RCLK signal would not be inverted since its rising edge occurs in the second half of the cycle of EXCLK. The following description describes how the circuit of FIG. 2a determines whether or not to use an inverted RCLK signal during locking.

As explained above, in one embodiment, both PNRM and PINV are initially set to 0, and the switch 173 is initially connected directly to the output from variable delay line 120, such that the signal DCLK is not inverted. As shown in the example of FIG. 2b, during a first loop around DLL 100', RCLK(L1) is delayed with respect to EXCLK, and RCLKB (L1) is the inverted RCLK(L1). Because both PNRM and PINV are initially 0, switch controller 163 does not instruct the switch 173 to change.

During each subsequent loop of the DLL circuit 100', if the phase detectors 130 and 150 detect that RCLK and RCLKB are not in phase with EXCLK, then DCLK is further delayed (e.g., using coarse locking) and the waveform signals of RCLK and RCLKB are also further delayed by variable delay line 120, such that the signals shift to the right in FIG. 2b. As such, FIG. 2b depicts exemplary waveform patterns for RCLK and RCLKB during a second, later loop than the first loop. As shown in FIG. 2b, waveforms RCLK(L2) and RCLKB(L2) have the same duty cycle as respective waveforms RCLK(L1) and RCLKB(L1), but are delayed and therefore appear shifted to the right.

In an exemplary embodiment, the waveform patterns for RCLK and RCLKB continue to delay further, and then at some point in time, one of windows Wa or Wb reach the rising edge of EXCLK. That is, a window may be associated with RCLK and RCLKB that represents a period of time during a cycle of RCLK and RCLKB. In one embodiment, the window for RCLK includes a time period between a rising edge of RCLK and some amount of time after the rising edge of RCLK, and the window for RCLKB includes a time period between a rising edge of RCLKB and some amount of time after the rising edge of RCLKB. Therefore, because each of RCLK and RCLKB has a window associated with the rising edge, and because each waveform shifts to the right during each subsequent loop of the DLL circuit, eventually one of the windows will reach the rising edge of EXCLK before the other.

When a first of the windows (Wa of RCLK or Wb of RCLKB) reaches a rising edge of EXCLK, then the phase detector associated with the waveform whose window reached the rising edge of EXCLK first detects that the rising edge of EXCLK is within the window, and changes its output to 1. For example, if the window of RCLK reaches a rising edge of EXCLK before the window of RCLKB, as shown in FIG. 2b in waveforms RCLK(L2) and RCLKB(L2), then first phase detector 130 detects the event, and outputs as PNRM the logical value 1. Conversely, if the window of RCLKB reaches a rising edge of EXCLK before the window of RCLK, then second phase detector 150 detects the event, and outputs as PINV the logical value 1.

At this point, in one embodiment, switch controller controls switch 173 based on which of PINV and PNRM has a logical value of 1. For example, in one embodiment, when PINV changes to 1, switch controller 163 instructs switch 173 to switch so that it is connected to the output of inverter 171 rather than being connected directly to the output of variable delay line 120. Alternatively, if PNRM changes to 1, switch controller 163 instructs switch 173 to remain connected directly to the output of variable delay line 120. In one embodiment, as discussed above, the value of PINV or PNRM is also sent to delay controller 190 and serves as a coarse locking end signal, which instructs the delay controller 190 to end coarse locking and begin fine locking.

FIG. 2b therefore depicts an exemplary situation in which a reproduction clock (RCLK) signal has a duty cycle error and the rising edge of the RCLK falls in the second half of the cycle of EXCLK. As a result, the non-inverted RCLK signal controls locking of the DLL circuit 100'. This results in the time T1, as shown in FIG. 2b, as the amount of delay shifting necessary to align the EXCLK and RCLK clocks, which is the same result as would have occurred if the typical fast locking inversion DLL circuit were used.

Figure 2C:
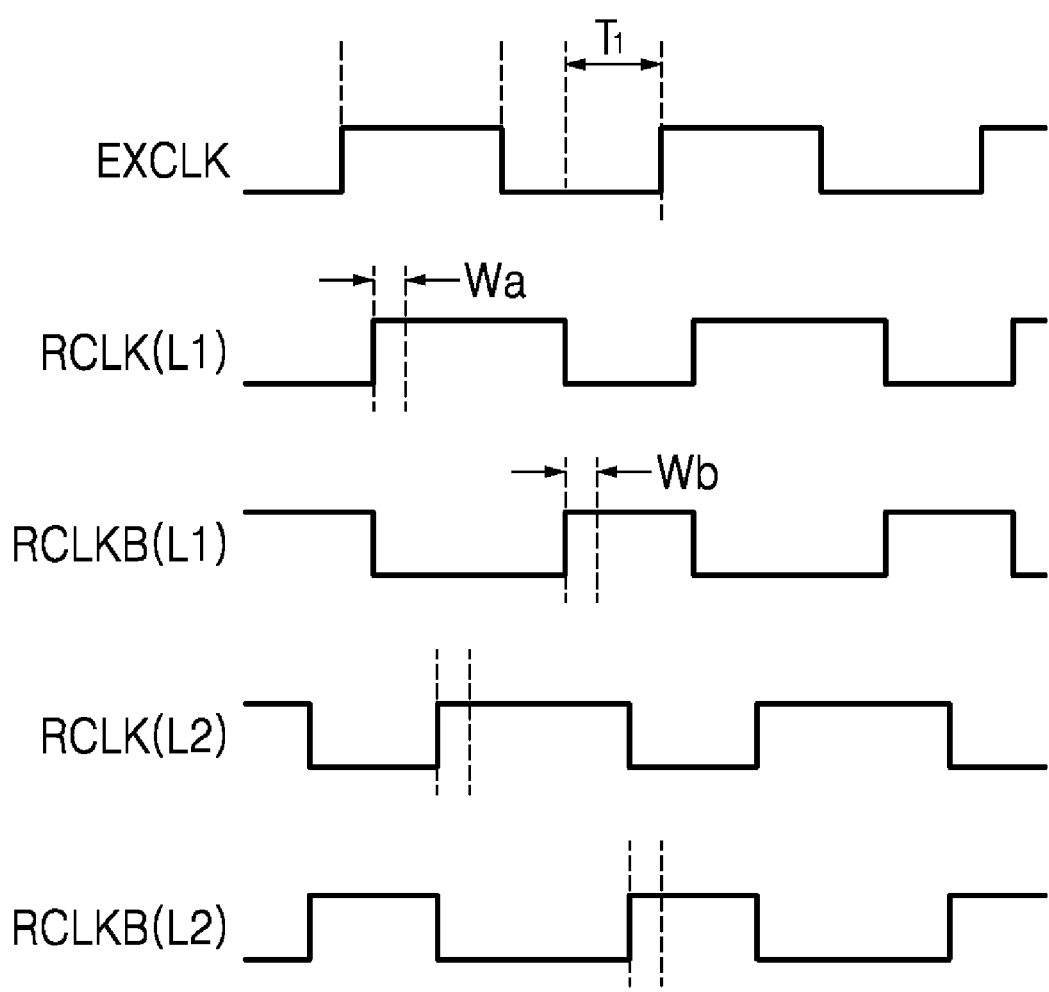

FIG. 2c depicts an exemplary situation in which a reproduction clock (RCLK) signal has a duty cycle error and the rising edge of the RCLK falls in the first half of the cycle of EXCLK, shown as RCLK(L1). Thus, as shown, RCLKB will have time window (Wb) associated with its rising edge that reaches the rising edge of EXCLK prior to the time window (Wa) of RCLK reaching the rising edge of EXCLK. As a result, the inverted signal, RCLKB controls locking of the DLL circuit 100'. This results in the time T1, as shown in FIG. 2c, as the amount of delay shifting necessary to align the EXCLK and RCLKB clocks, which is the same result as would have occurred if the typical fast locking inversion DLL circuit were used.

Figure 2D:
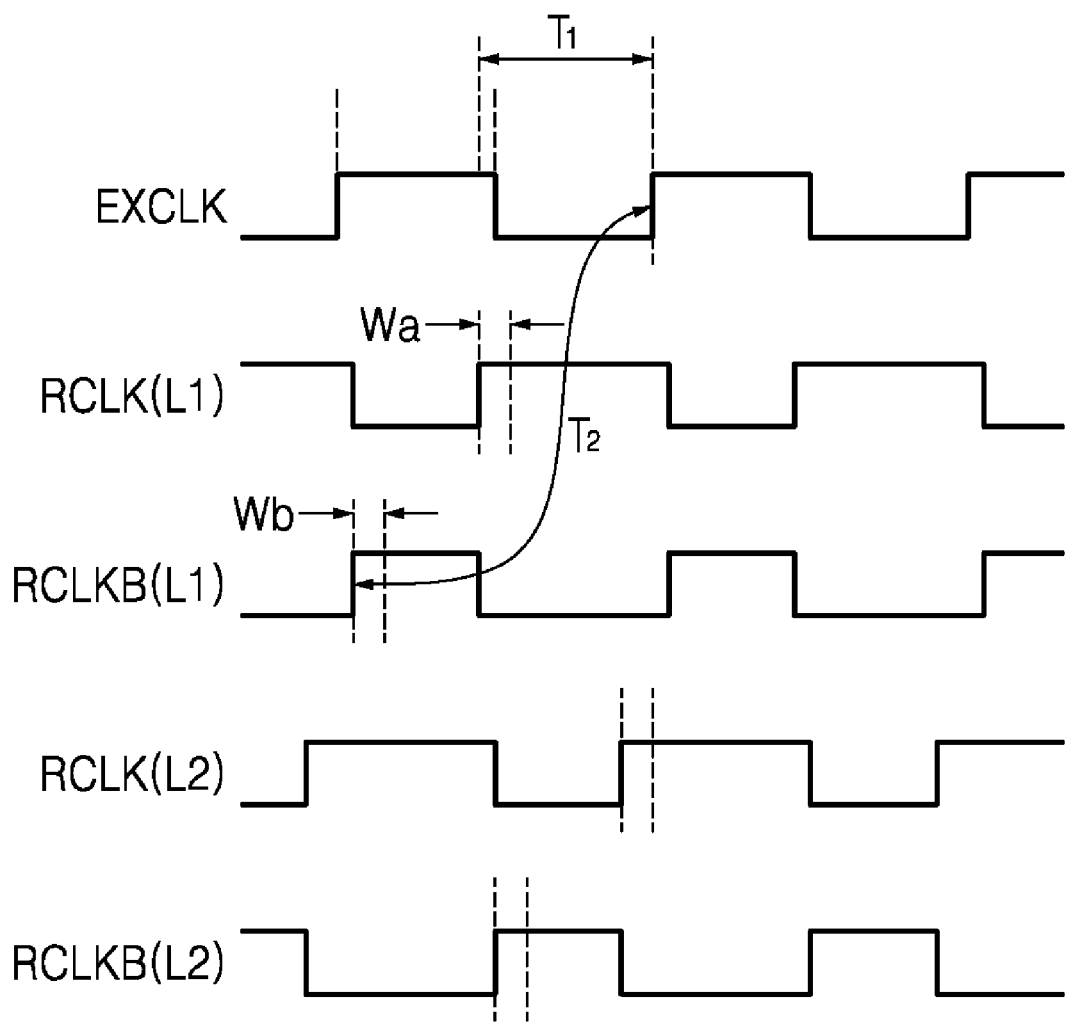

FIG. 2d depicts an exemplary situation in which a reproduction clock (RCLK) signal has a duty cycle error and the rising edge of the RCLK falls in the first half of the cycle of EXCLK, shown as RCLK(L1). However, in this situation, RCLK will have time window (Wa) associated with its rising edge that reaches the rising edge of EXCLK prior to the time window (Wb) of RCLK reaching the rising edge of EXCLK. As a result, the non-inverted signal RCLK controls locking of the DLL circuit 100'. This results in the time T1, as shown in FIG. 2d, as the amount of delay shifting necessary to align the EXCLK and RCLK clocks. The example in FIG. 2d results in faster locking than if a conventional fast locking inversion circuit is used. That is, in the conventional fast locking inversion circuit, because the rising edge of RCLK initially falls within the first half of the cycle of EXCLK, the RCLK signal would be inverted, and the inverted signal used to establish locking. However, as shown in FIG. 2d, if this were the case, then a delay shifting of T2 would be necessary to establish locking. As shown, T2 is longer than T1. As such, the circuit disclosed in FIG. 2a achieves faster locking than typical fast locking inversion DLL circuits.

Although the EXCLK in the examples above is shown as having a duty cycle of 50%, other duty cycles for EXCLK are possible. For example, in one embodiment, EXCLK can have the same duty cycle as RCLK and RCLKB.

The inversion controller 160 shown in FIG. 2a detects which of the reproduction clock signal RCLK and the inverted reproduction clock signal RCLKB has a rising edge time window that first reaches a rising edge of the received clock signal EXCLK, and determines whether to invert the received clock signal EXCLK based on a detection result. For instance, when after a series of delay loops of DLL 100', a rising edge of the received clock signal EXCLK occurs during the rising edge time window of the reproduction clock signal RCLK prior to occurring during a rising edge time window of signal RCLKB, the inversion controller 160 determines not to invert the received clock signal EXCLK. When, after a series of delay loops of DLL 100', a rising edge of the received clock signal EXCLK occurs during the rising edge time window of the inverted reproduction clock signal RCLKB prior to occurring during a rising edge time window of signal RCLK, the inversion controller 160 determines to invert the received clock signal EXCLK.

The inversion unit 170 selectively outputs either the delayed clock signal DCLK or the inverted delayed clock signal based on the switch control signal from the switch controller 163.

Figure 3:
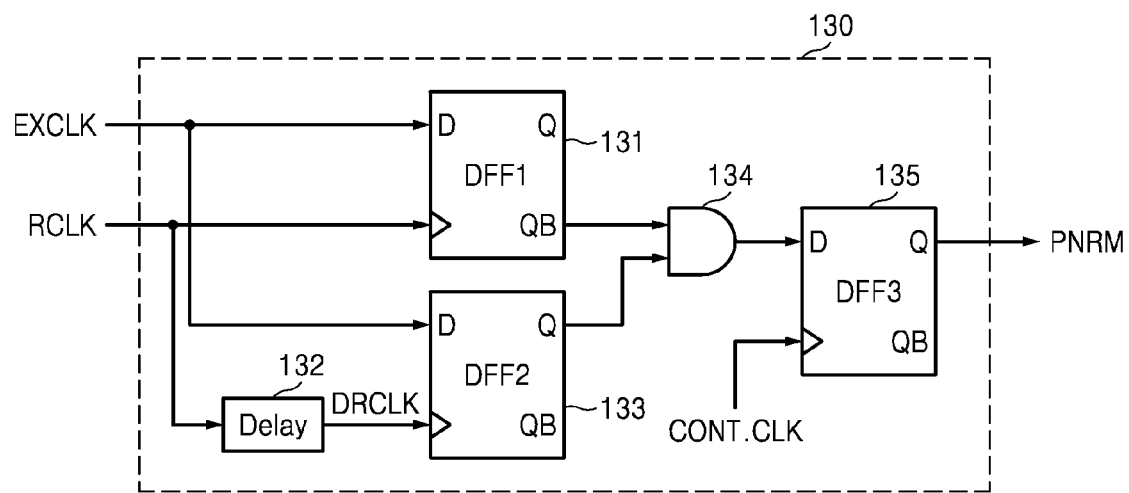

FIG. 3 is a schematic block diagram of the portion of first phase detector 130 that outputs the signal PNRM. Referring to FIG. 3, this portion of the first phase detector 130 includes a first flip-flop 131, a delay element 132, a second flip-flop 133, a logic circuit 134, and a third flip-flop 135.

The first flip-flop 131 receives the received clock signal EXCLK through an input terminal and the reproduction clock signal RCLK through a clock terminal and outputs a high signal when the received clock signal EXCLK is at a high level at a rising edge of the reproduction clock signal RCLK and outputs a low signal when the received clock signal EXCLK is at a low level at the rising edge of the reproduction clock signal RCLK.

The delay element 132 delays the reproduction clock signal RCLK a predetermined period of time. For example, the delay element 132 may delay the reproduction clock signal RCLK based on a duty error of the reproduction clock signal RCLK (e.g., if the duty cycle is 45%, then the delay can be set to the amount of time in 5% of one cycle). In one embodiment, the delay is a constant value set based on an expected average duty cycle error.

The second flip-flop 133 receives the received clock signal EXCLK through an input terminal and a delayed reproduction clock signal DRCLK output from the delay element 132 through a clock terminal and outputs a high signal when the received clock signal EXCLK is at the high level at a rising edge of the delayed reproduction clock signal DRCLK and outputs a low signal when the received clock signal EXCLK is at the low level at the rising edge of the delayed reproduction clock signal DRCLK.

The logic circuit 134 is implemented by an AND gate and performs an AND operation on a negative output signal QB of the first flip-flop 131 and an output signal Q of the second flip-flop 133. In other words, when the output signal Q of the first flip-flop 131 is at a logic low and the output signal Q of the second flip-flop 133 is at a logic high, the logic circuit 134 output a high signal.

The third flip-flop 135 receives the output signal of the logic circuit 134 through an input terminal and a clock control signal CONT.CLK through a clock terminal and latches the signals. The output signal Q is output as PNRM. Although FIG. 3 depicts different flip flops to implement the phase detector, other devices can be used to achieve the same result, such as, for example, differential amplifiers.

Accordingly, the first phase detector 130 outputs a high signal when the received clock signal EXCLK transits from the low level to the high level within a time window between the time that RCLK transitions from low to high and a time that DRCLK transitions from low to high. In one embodiment, this time window becomes the time window used in the DLL circuit 100' of FIG. 2a to determine when the switch controller 163 outputs an instruction to control switch 173.

In one embodiment, the structure and the operation of the second phase detector 150 are the same as those of the first phase detector 130 illustrated in FIG. 3, with the exception that the inverted reproduction clock signal RCLKB instead of the reproduction clock signal RCLK is input to the second phase detector 150.

Figure 6:
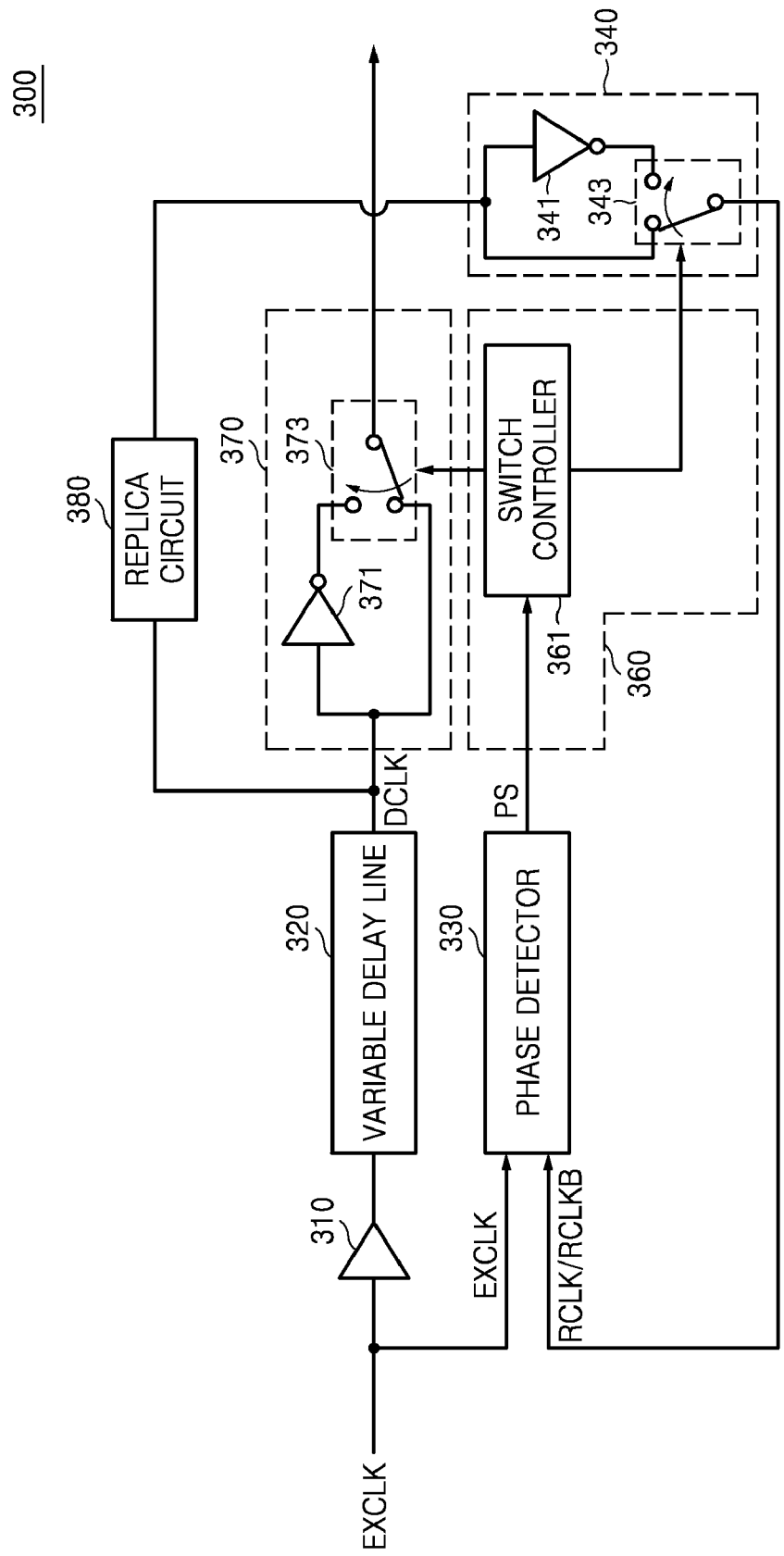
FIG. 6 is an exemplary schematic block diagram of a DLL according to further embodiments.

In the embodiments illustrated in FIGS. 2a and 3, a path for comparing the received clock signal EXCLK with the reproduction clock signal RCLK and a path for comparing the received clock signal EXCLK with the inverted reproduction clock signal RCLKB are separately provided and whether to perform inversion is determined based on the signals transmitted through both of the paths. However, the disclosed embodiments are not restricted to these embodiments to achieve fast coarse locking by comparing a received clock signal with a reproduction clock signal and an inverted reproduction clock signal. For instance, as illustrated in FIGS. 4 and 6, a reproduction clock signal and an inverted reproduction clock signal are alternately compared with a received clock signal every cycle of the received clock signal and a phase difference between the received clock signal and each of the reproduction and the inverted reproduction clock signals is detected using a single phase difference detection path to perform fast coarse locking.

Figure 4:
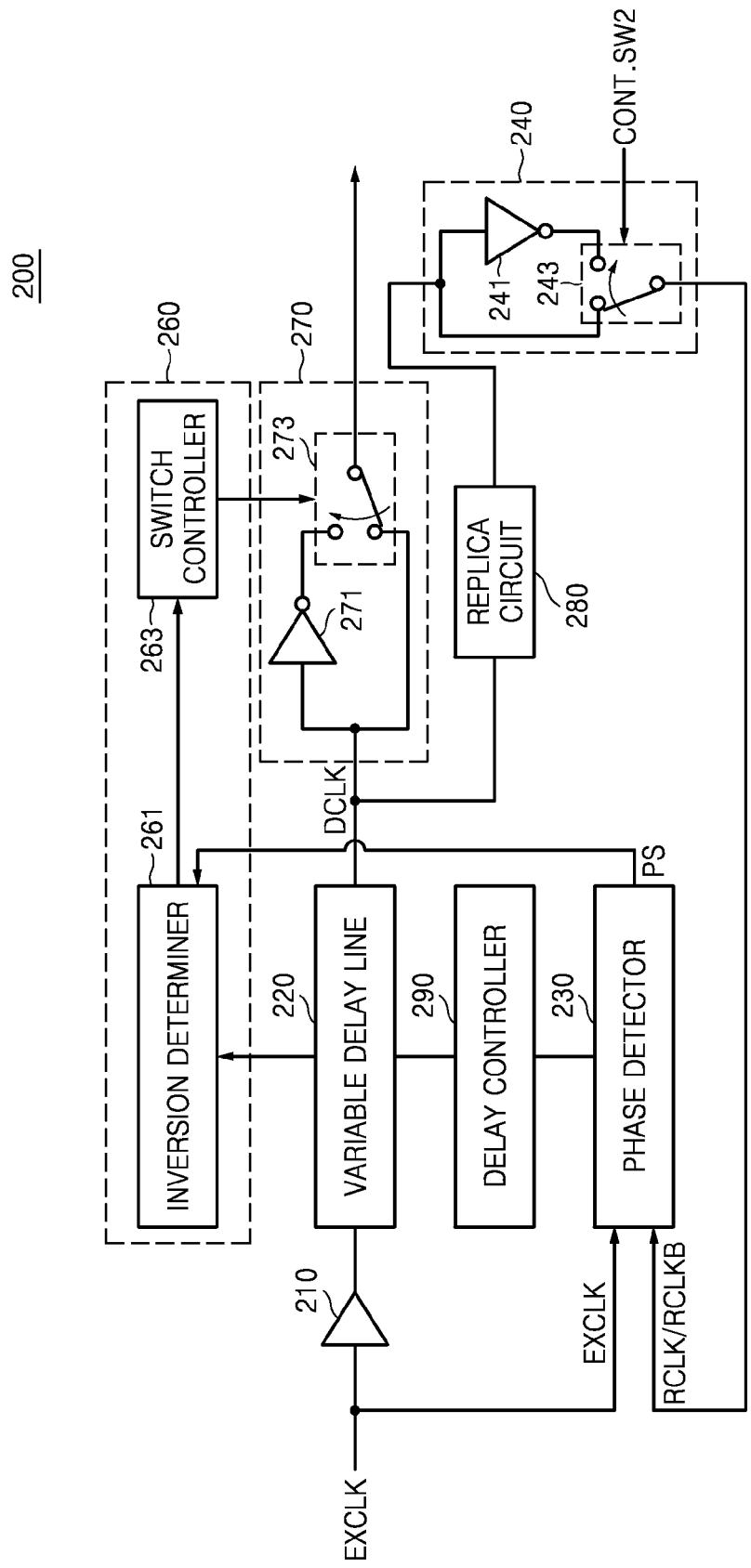
FIG. 4 is an exemplary schematic block diagram of a DLL according to other embodiments.

FIG. 4 is a schematic block diagram of a DLL 200 according to other exemplary embodiments. Referring to FIG. 4, the DLL 200 includes an input buffer 210, a variable delay line 220, a phase detector 230, a delay clock signal inverter 240, an inversion controller 260, an inversion unit 270, replica circuit 280, and delay controller 290.

The input buffer 210 receives and buffers an external clock signal or a received clock signal EXCLK. The variable delay line 220 generates a delayed clock signal DCLK following behind the phase of the received clock signal EXCLK in response to a delay control signal. In addition, the variable delay line 220 stores a position of a delay cell generating the delayed clock signal DCLK (discussed further in connection with FIG. 5 below), and sends the position of the delay cell to the inversion controller 260 so that either inversion or non-inversion is determined using the position. The structure of the variable delay line 220 for this operation is illustrated in FIG. 5.

Figure 5:
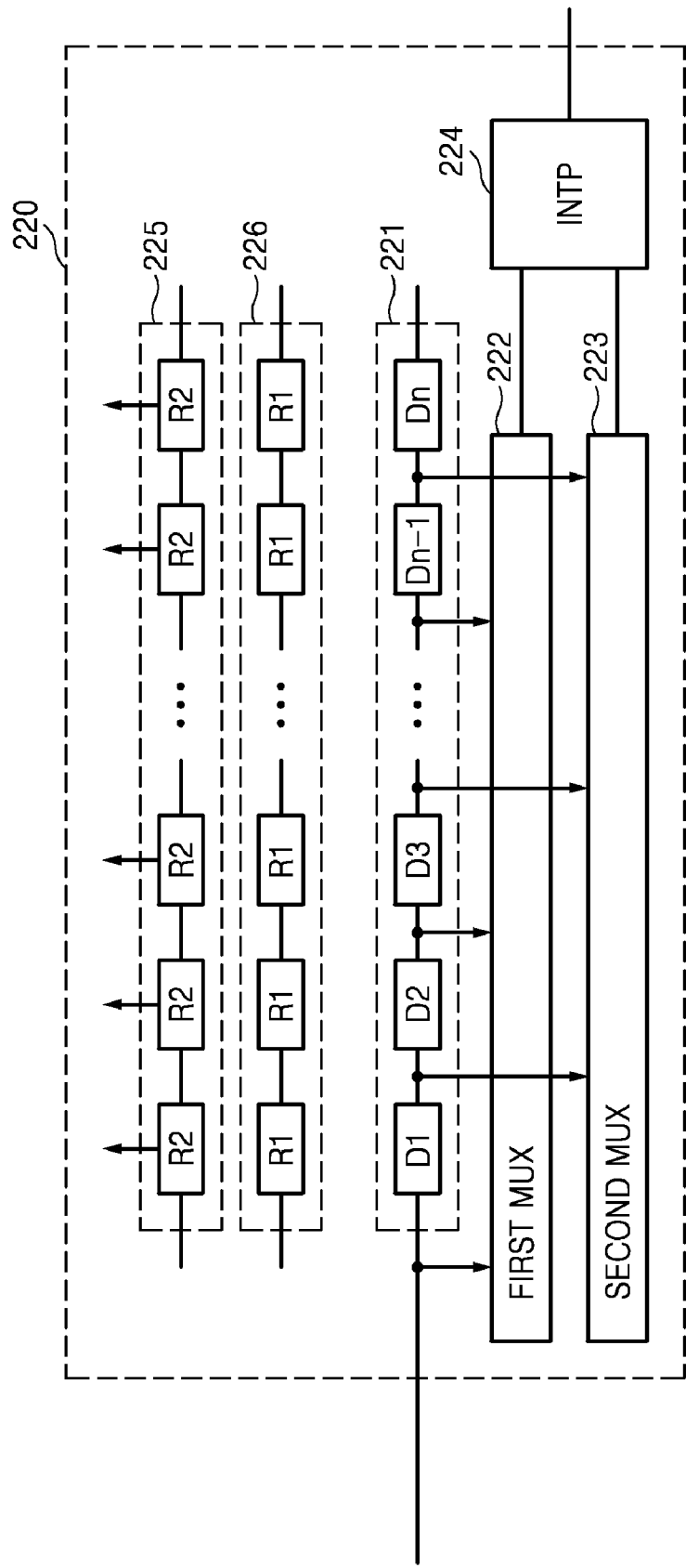
FIG. 5 is an exemplary schematic block diagram of a variable delay line illustrated in FIG. 4.

Referring to FIG. 5, the variable delay line 220 includes a delay unit 221 which includes a plurality of delay cells D1 through Dn; a first MUX 222 and a second MUX 223 for selecting and outputting two adjacent clock signals from among clock signals, which are respectively output from the delay cells D1 through Dn and have different delay characteristics; an interpolator 224 which interpolates the two clock signals respectively selected by the first and second MUXs 222 and 223; a first register 225 which stores a position of a delay cell generating the reproduction clock signal RCLK; and a second register 226 which stores a position of a delay cell generating the inverted reproduction clock signal RCLKB. When coarse locking ends, the variable delay line 220 compares the delay cell's position stored in the first register 225 with the delay cell's position stored in the second register 226 and sends the position of the delay cell that would cause a smaller delay time to reach the rising edge of EXCLK to the inversion controller 260 in FIG. 4.

Referring back to FIG. 4, the phase detector 230 detects a phase difference between the received clock signal EXCLK and the reproduction clock signal RCLK or the inverted reproduction clock signal RCLKB output from the replica circuit 280 through delay clock signal inverter 240 and outputs a phase difference detection signal PS to the inversion controller 260. In detail, the phase detector 230 determines whether a rising edge of the received clock signal EXCLK occurs during a time window between the reproduction clock signal RCLK or the inverted reproduction clock signal RCLKB and a delayed signal DRCLK, as depicted, for example, in FIG. 3. The structure and the operation of the phase detector 230 are similar to those explained with reference to FIG. 3.

The delayed clock signal inverter 240 inverts or non-inverts the delayed clock signal output from replica circuit 280 at each cycle of the received clock signal EXCLK. For this operation, the delayed clock signal inverter 240 includes an inverter 241 which inverts the delayed clock signal output from replica circuit 280 and a switch 243 which selectively connects an inversion line or a non-inversion line for the delayed clock signal output from replica circuit 280 to an input terminal of phase detector 230. The switch 243 operates in response to a second switch control signal CONT.SW2, which causes switch 243 to switch at each cycle of EXCLK. In one embodiment, switch 243 is initially connected directly to the output from replica circuit 280.

The inversion controller 260 determines the inversion or non-inversion of the received clock signal EXCLK based on the phase difference detection signal PS output from the phase detector 230. The inversion controller 260 includes an inversion determiner 261 and a switch controller 263. The inversion determiner 261 determines the inversion or non-inversion of the received clock signal EXCLK based on information stored in the first and second registers 225 and 226 (FIG. 5), that is, based on a position of a delay cell generating the delayed clock signal DCLK and a position of a delay cell generating the inverted delayed clock signal when the end of coarse locking is determined based on the phase difference detection signal PS. The switch controller 263 outputs a switch control signal deciding the inversion or non-inversion of the received clock signal EXCLK based on an output signal of the inversion determiner 261. For instance, when at the end of coarse locking, the position of the delay cell generating the reproduction clock signal RCLK causes a delay closer to reaching the rising edge of EXCLK than the delay caused by the position of the delay cell generating the inverted reproduction clock signal RCLKB, the switch controller 263 outputs a switch control signal for the non-inversion of the received clock signal EXCLK. In an opposite case, the switch controller 263 outputs a switch control signal for the inversion of the received clock signal EXCLK.

The inversion unit 270 selectively outputs the delayed clock signal DCLK or the inverted delayed clock signal based on an inversion control signal, i.e., a switch control signal output from the switch controller 263. The inversion unit 270 includes an inverter 271 which inverts an output signal of the variable delay line 220 and a switch 273 which selectively outputs an output signal of the inverter 271 or the output signal of the variable delay line 220.

FIG. 6 is a schematic block diagram of a DLL 300 according to further disclosed embodiments. Referring to FIG. 6, the DLL 300 includes an input buffer 310, a variable delay line 320, a phase detector 330, a delayed clock signal inverter 340, an inversion controller 360, an inversion unit 370, replica circuit 380, and a delay controller 390.

The input buffer 310 receives and buffers an external or a received clock signal EXCLK. The variable delay line 320 generates a delayed clock signal DCLK following the phase of the received clock signal EXCLK in response to a delay control signal. For this operation, the variable delay line 320 may include a plurality of unit delay cells; a MUX which selects two adjacent clock signals from among clock signals output from the unit delay cells and having different delay characteristics; and an interpolator which interpolates the two clock signals selected by the MUX.

The phase detector 330 detects a phase difference between the received clock signal EXCLK and the reproduction clock signal RCLK or the inverted reproduction clock signal RCLKB output from the delayed clock signal inverter 340 through replica circuit 380 and outputs a phase difference detection signal PS to the inversion controller 360. More specifically, the phase detector 330 determines whether a rising edge of the received clock signal EXCLK first occurs during a time window associated with the rising edge of the reproduction clock signal RCLK or during a time window associated with a rising edge of the inverted reproduction clock signal RCLKB. The structure and the operation of the phase detector 330 are similar to those explained with reference to FIG. 3.

The delayed clock signal inverter 340 inverts or non-inverts the delayed clock signal DCLK at each cycle of the received clock signal EXCLK. For this operation, the delayed clock signal inverter 340 includes an inverter 341 which inverts the delayed clock signal DCLK and a first switch 343 which selectively connects an inversion line or a non-inversion line for the delayed clock signal DCLK to an input terminal of replica circuit 380, which is connected to the phase detector 330.

The inversion controller 360 determines the inversion or non-inversion of the received clock signal EXCLK based on the phase difference detection signal PS output from the phase detector 330. The inversion controller 360 includes a switch controller 361. The switch controller 361 outputs a control signal for controlling the first switch 343 to alternately select an inversion line and a non-inversion line for the delayed clock signal DCLK every cycle of the received clock signal EXCLK. The first switch controller 361 also determines whether coarse locking has ended based on the phase difference detection signal PS output from the phase detector 330 and determines the inversion or non-inversion of the received clock signal EXCLK based on the output signal for controlling the first switch 343.

The inversion unit 370 selectively outputs the delayed clock signal DCLK or the inverted delayed clock signal based on an inversion control signal output from the switch controller 361. The inversion unit 370 includes an inverter 371 which inverts an output signal of the variable delay line 320 and a switch 373 which selectively outputs an output signal of the inverter 371 or the output signal of the variable delay line 320.

Figure 7:
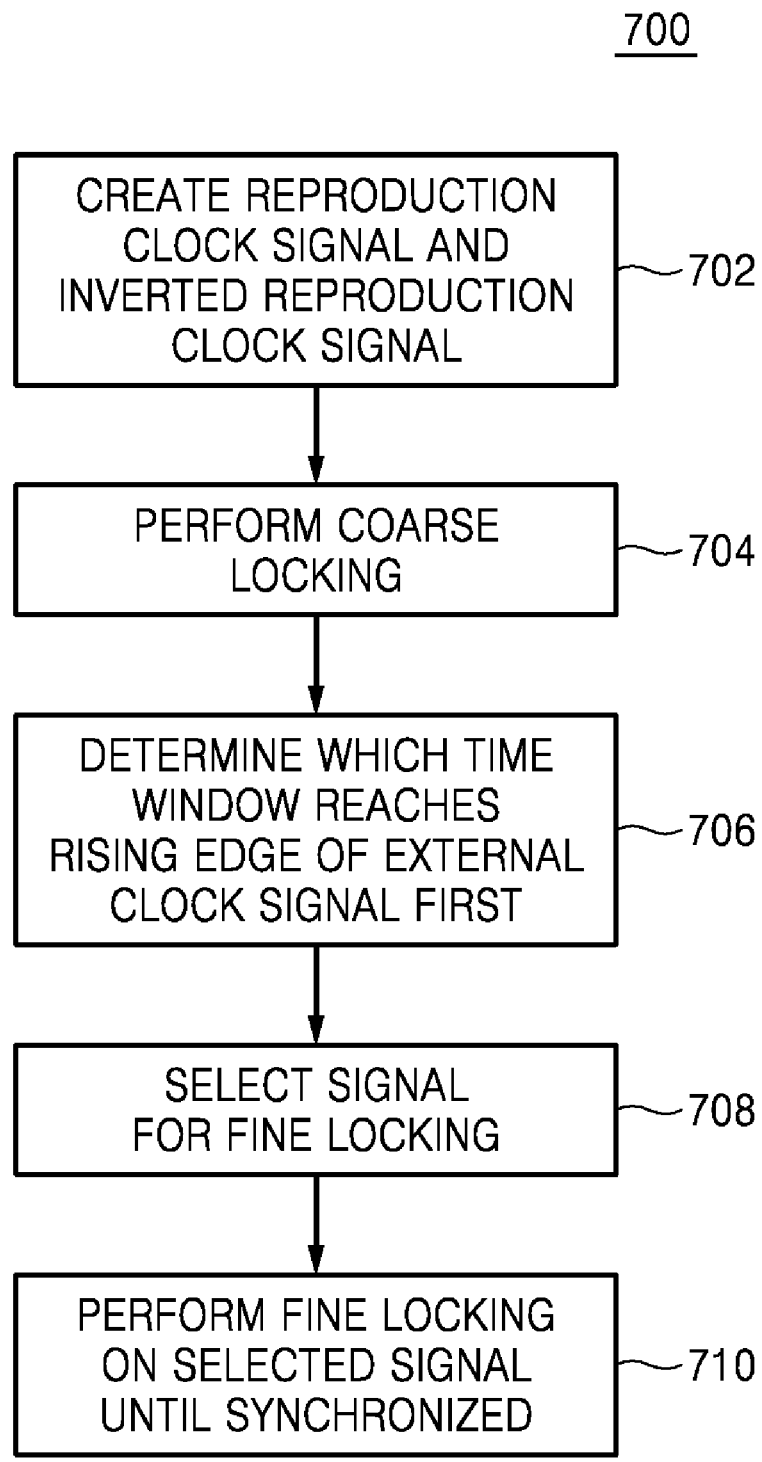
FIG. 7 is a block diagram illustrating a method consistent with certain disclosed embodiments.

FIG. 7 depicts an exemplary method 700 of performing a locking operation using a DLL such as described in the embodiments above. Although the steps shown in FIG. 7 appear in a particular order, they need not necessarily be performed in that order.

As shown, in step 702, a reproduction clock signal and an inverted reproduction clock signal are created. In one embodiment, these signals are delayed signals (one inverted, one non-inverted) corresponding to an external clock signal, and the signals are fed back into respective phase detectors. For example, they may be created using a DLL such as shown in FIG. 2a, or alternatively using the DLLs shown in FIG. 4 or 6. The reproduction clock signals may have a duty cycle that differs or is the same as a duty cycle of an external clock signal input into the DLL.

Next, in step 704, coarse locking is performed on the reproduction clock signal and the inverted reproduction clock signal. For example, as discussed above, a variable delay line may be used to iteratively delay the external clock signal, such that after each loop of the circuit, the reproduction clock signal and inverted reproduction clock signals are delayed an additional amount. Phase detectors such as described above may be used to implement the coarse locking, and to further determine whether either of the reproduction clock signal or the inverted clock reproduction signal are close to being in phase with the external clock signal (e.g., have a window of time approaching a rising edge of the external clock signal).

In step 706, it is determined, for example by the phase detectors, which time window—that of the reproduction clock signal or that of the inverted reproduction clock signal—reaches a rising edge of an external clock signal first. For example, as described above, one or more phase detectors such as shown in FIG. 3 can be used to make this determination.

In step 708, based on the determination, one of the signals—either the reproduction clock signal or the inverted reproduction clock signal—is selected to be the signal used to synchronize with the external clock signal. For example, in one embodiment, if the time window of the inverted reproduction clock signal reaches the rising edge of the external clock signal first, then an inverted reproduction clock signal is used for fine locking; and if the time window of the non-inverted reproduction clock signal reaches the rising edge of the external clock signal first, then a non-inverted reproduction clock signal is used for fine locking.

Fine locking may then be performed on the selected signal until the selected signal is synchronized with the external clock signal (step 710).

Figure 8:
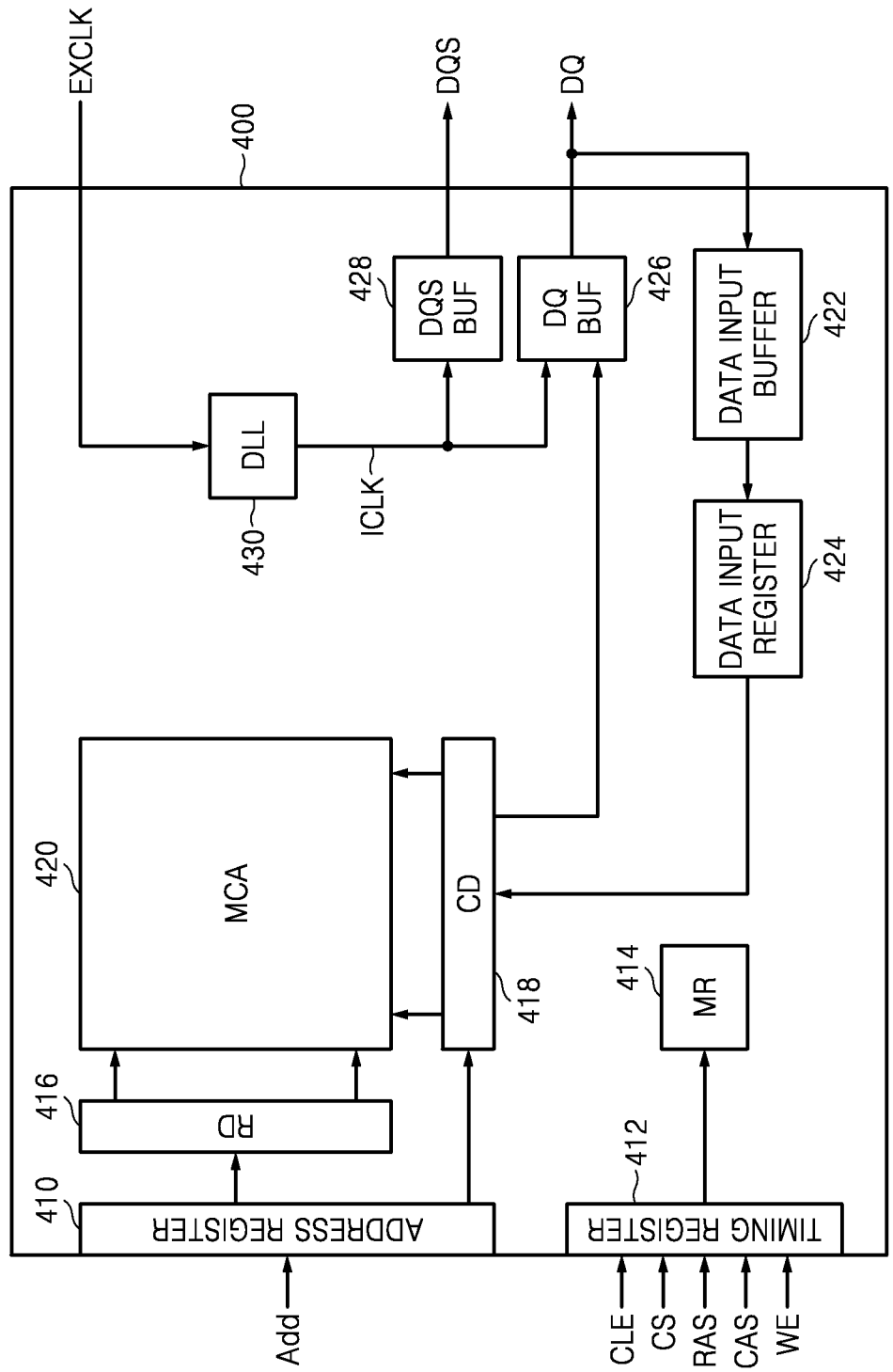
FIG. 8 is a schematic block diagram of a semiconductor memory device including a DLL according to one exemplary embodiment.
Figure 9:
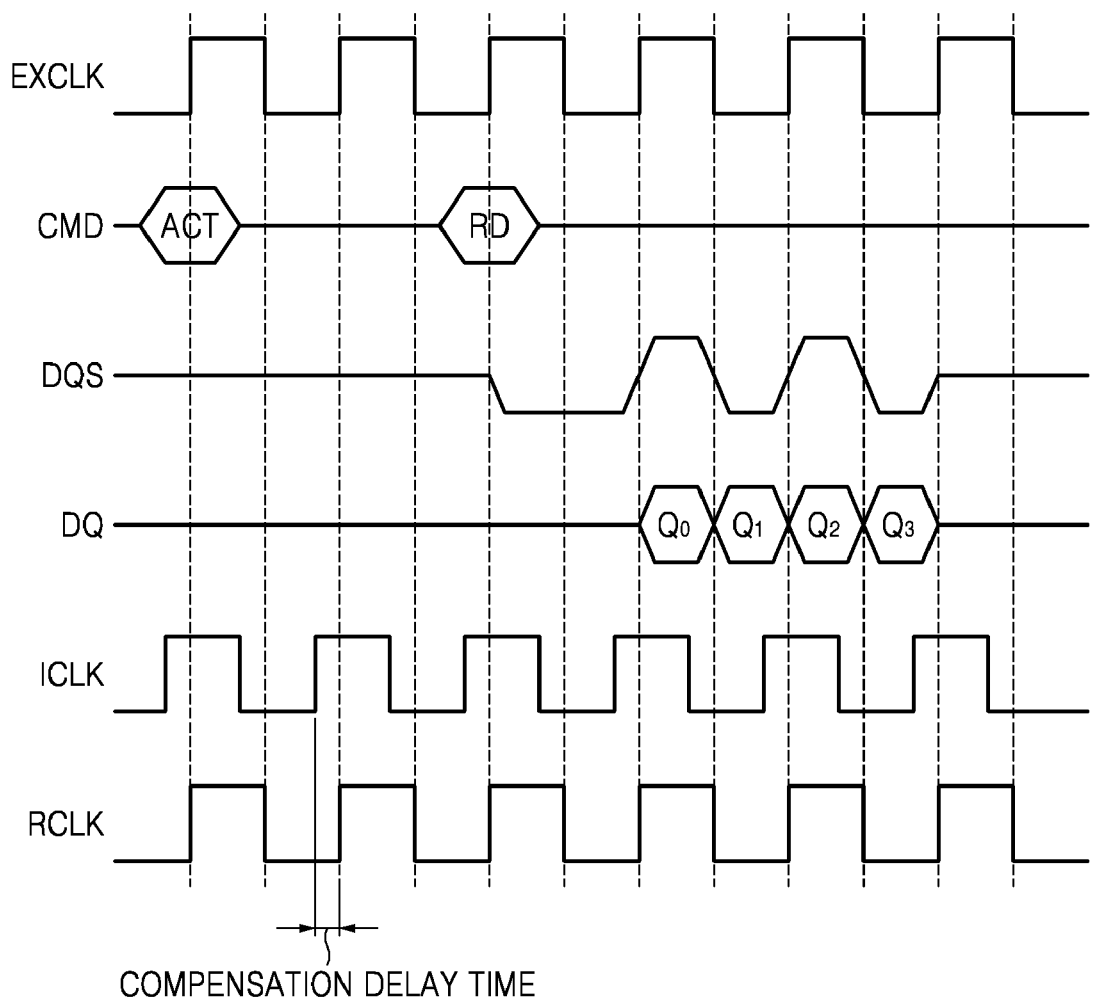
FIG. 9 is an exemplary timing diagram of the semiconductor memory device illustrated in FIG. 8.

FIG. 8 is a schematic block diagram of a semiconductor memory device 400 including a DLL 430 according to an exemplary embodiment. The semiconductor memory device 400 is a synchronous dynamic random access memory (SDRAM) device. FIG. 9 is a timing diagram of the semiconductor memory device 400 illustrated in FIG. 8.

Referring to FIG. 8, the semiconductor memory device 400 includes an address register and buffer unit 410, a timing register 412, a mode register 414, a row decoder 416, a column decoder 418, a memory cell array 420, a data input buffer 422, a data input register 424, a data output buffer 426, a data strobe output buffer 428, and the DLL 430. The SDRAM device 400 outputs data in synchronization with an external clock signal EXCLK. Accordingly, the SDRAM device 400 includes the DLL 430 therewithin to generate an internal clock signal ICLK following behind the phase of the external clock signal EXCLK and controls the data output buffer 426 and the data strobe output buffer 428 based on the internal clock signal ICLK.

Referring to FIG. 9, the phase of the internal clock signal ICLK leads the phase of the external clock signal EXCLK by a delay time of data path. Accordingly, the DLL 430 delays the internal clock signal ICLK by the delay time of the data path to synchronize the phase of an output clock signal (e.g., a reproduction clock signal RCLK or inverted reproduction clock signal RCLKB) with the phase of the external clock signal EXCLK. In other words, the DLL 430 delays the internal clock signal ICLK by a compensation delay time corresponding to time taken for output data to be output to an output path through the data path. Consequently, a data strobe signal DQS, a data output signal DQ, and the reproduction clock signal RCLK have the same phase as that of the external clock signal EXCLK.

Figure 10:
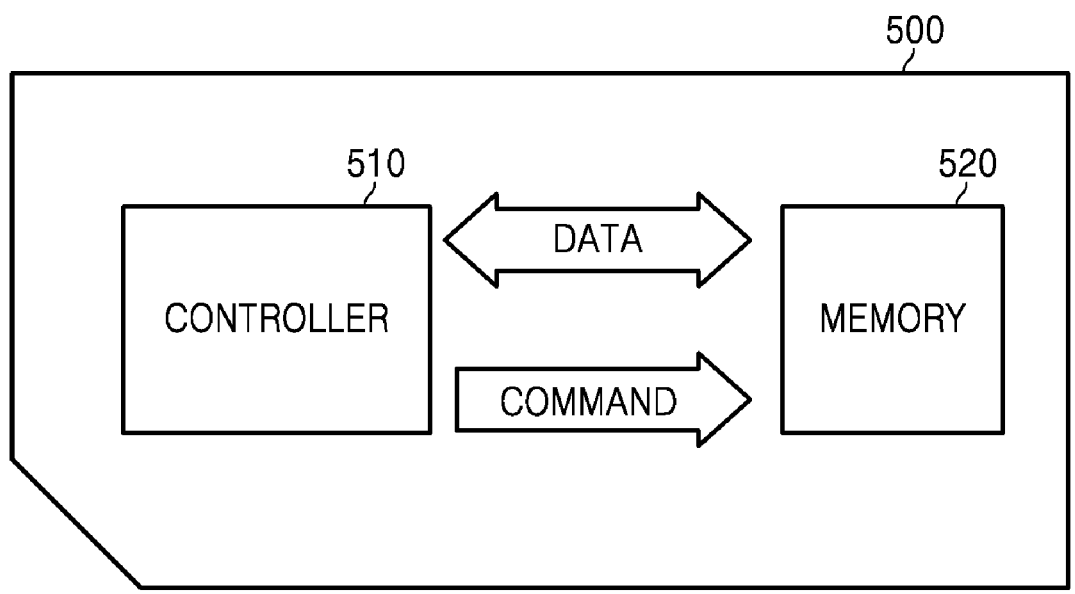
FIG. 10 is a schematic diagram illustrating a memory card according to an exemplary embodiment.

FIG. 10 is a schematic diagram illustrating a memory card 500 according to example embodiments. Referring to FIG. 10, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include the device described above in reference to FIG. 8.

Such a memory card 500 may be used as a storage medium for various portable electronic devices. For example, the memory card 500 may be a multimedia card (MMC) or a secure digital (SD) card.

Figure 11:
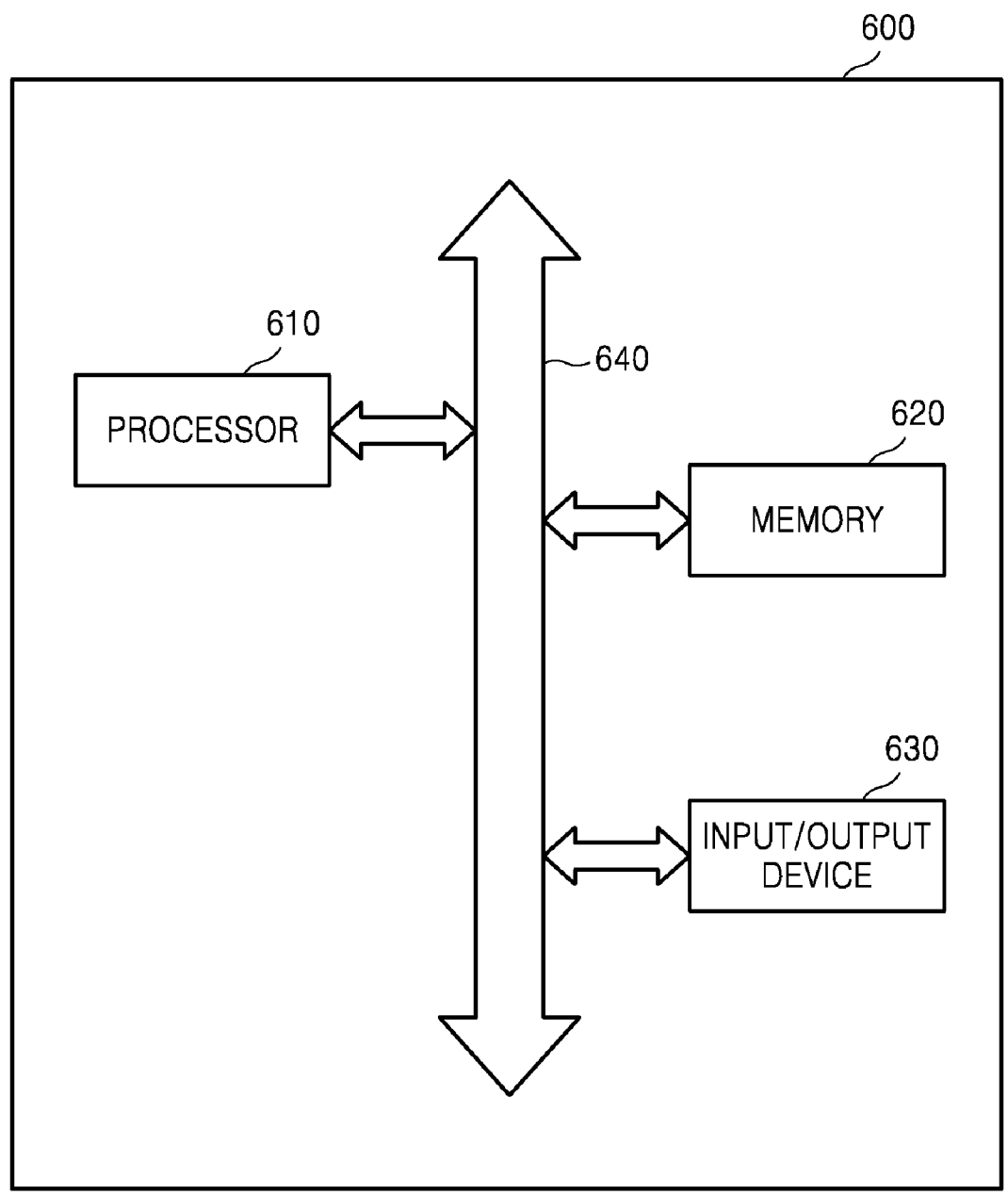
FIG. 11 is a block diagram roughly illustrating an electronic system according to an exemplary embodiment.

FIG. 11 is a block diagram roughly illustrating an electronic system 600 according to example embodiments. Referring to FIG. 11, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. In addition, the memory 620 may include the non-volatile memory device described above in reference to FIG. 8.

For example, such an electronic system 600 may embody various electronic control systems requiring the memory 620, and, for example, may be used in mobile phones, MP3 players, navigation devices, solid state disks (SSD), or household appliances.

As described above, according to some exemplary embodiments, the phase of each of a non-inverted reproduction clock signal and an inverted reproduction clock signal is compared with the phase of a received external clock signal and the clock signal with respect to which coarse locking has been completed first is selected between the non-inverted and the inverted reproduction clock signals to be used for fine locking. Accordingly, initial locking, i.e., coarse locking is performed quickly and accurately regardless of a duty error window, and the delay time associated with achieving locking is minimized.

While various examples have been particularly shown and described with reference to exemplary embodiments thereof, it will be understood by those of ordinary skill in the art that various changes in forms and details may be made therein without departing from the spirit and scope of the disclosed embodiments as defined by the following claims.

What is claimed is:

1. A method of performing fast locking in a delay locked loop circuit, comprising:
   performing a first comparison comparing an input clock signal to a first feedback clock signal that is a non-inverted feedback clock signal;
   performing a second comparison comparing the input clock signal to a second feedback clock signal that is the feedback clock signal inverted;
   based on the first and second comparisons, selecting one of the non-inverted feedback clock signal or the inverted feedback clock signal to synchronize with the input clock signal; and
   synchronizing the selected clock signal with the input clock signal.

2. The method of claim 1, wherein:
   performing the first comparison comprises determining whether an edge of the input clock signal occurs within a time window associated with an edge of the first feedback clock signal;
   performing the second comparison comprises determining whether an edge of the input clock signal occurs within a time window associated with an edge of the second feedback clock signal; and
   selecting includes:
      selecting the non-inverted feedback clock signal if it is determined that the edge of the input clock signal occurs within the time window associated with the edge of the first feedback clock signal before it is determined that the edge of the input clock signal occurs within the time window associated with the edge of the second feedback clock signal; and
      selecting the inverted feedback clock signal if it is determined that the edge of the input clock signal occurs within the time window associated with the edge of the second feedback clock signal before it is determined that the edge of the input clock signal occurs within the time window associated with the edge of the first feedback clock signal.

3. The method of claim 2, further comprising:
   performing the first comparison by a first phase detector; and
   performing the second comparison by a second phase detector.

4. The method of claim 3, further comprising:
   performing coarse locking by the first phase detector prior to the selecting; and
   performing fine locking by the first phase detector subsequent to the selecting.

5. The method of claim 2, wherein selecting one of the non-inverted feedback clock signal or the inverted feedback clock signal to synchronize with the input clock signal includes controlling a switch that is connected to an inverter.

6. The method of claim 5, wherein controlling the switch further comprises:
   connecting the switch to the output of a variable delay line to select the non-inverted feedback clock signal; and
   connecting the switch to the output of an inverter to select the inverted feedback clock signal.

7. The method of claim 1, wherein each of the first and second feedback clock signals has a duty error.

8. A method of synchronizing an external clock signal with a clock signal used for a circuit element, the method comprising:
   creating a reproduction clock signal;
   creating an inverted reproduction clock signal that is an inversion of the reproduction clock signal;
   performing coarse locking for the reproduction clock signal during a first period of time;
   performing coarse locking for the inverted reproduction clock signal during the first period of time;
   determining whether to perform fine locking on the reproduction clock signal or the inverted reproduction clock signal;
   based on the determining, selecting one of the reproduction clock signal and the inverted reproduction clock signal for which to perform fine locking; and
   performing fine locking on the selected clock signal during a second period of time until the selected clock signal is synchronized with the external clock signal.

9. The method of claim 8, wherein the first period of time occurs before the second period of time.

10. The method of claim 8, wherein:
    performing coarse locking for the reproduction clock signal includes iteratively delaying the reproduction clock signal;
    performing coarse locking for the inverted reproduction clock signal includes iteratively delaying the inverted reproduction clock signal; and
    the determining step further comprises determining which one of a time window associated with the rising edge of the reproduction clock signal and a time window associated with the rising edge of the inverted reproduction clock signal reaches a rising edge of the external clock signal first.

11. The method of claim 10, wherein:
    if the time window associated with the rising edge of the reproduction clock signal reaches a rising edge of the external clock signal first, then selecting the reproduction clock signal for which to perform fine locking; and if the time window associated with the rising edge of the inverted reproduction clock signal reaches a rising edge of the external clock signal first, then selecting the inverted reproduction clock signal for which to perform fine locking.

12. A delay-locked loop comprising:
a variable delay line configured to delay an input clock signal and output a delayed clock signal in response to a delay control signal;
a replica circuit that receives the delayed clock signal and outputs a reproduction clock signal;
a first phase detector configured to compare a phase of the reproduction clock signal with the phase of the input clock signal, and output a first phase difference detection signal;
a second phase detector configured to compare a phase of an inverted reproduction clock signal, obtained by inverting the reproduction clock signal, with the phase of the input clock signal, and output a second phase difference detection signal;
an inversion controller configured to output an inversion control signal deciding inversion or non-inversion of the delayed clock signal based on the first and second phase difference detection signals; and
an inversion unit configured to selectively output the delayed clock signal or the inverted delayed clock signal based on the inversion control signal.

13. The delay-locked loop of claim 12, wherein the first phase detector and the second phase detector are different phase detectors.

14. The delay-locked loop of claim 12, wherein the first phase detector outputs the first phase difference detection signal based on whether a rising edge of the input clock signal occurs in a time window associated with the reproduction clock signal and the second phase detector outputs the second phase difference detection signal based on whether a rising edge of the input clock signal occurs in a time window associated with the inverted reproduction clock signal.

15. The delay-locked loop of claim 14, wherein the inversion controller controls the delayed clock signal to be inverted when the rising edge of the input clock signal occurs in the time window of the inverted reproduction clock signal before it occurs in the time window of the reproduction clock signal.

16. The delay-locked loop of claim 15 wherein the first phase detector and the second phase detector each create the respective time windows.

17. The delay-locked loop of claim 12, wherein the variable delay line is configured to perform coarse locking and fine locking, and, based on a combination of the first phase difference detection signal and the second phase difference detection signal, the delay-locked loop determines to end coarse locking and begin fine locking by the variable delay line.

18. The delay-locked loop of claim 12, wherein the first phase detector and the second phase detector are the same phase detector.

19. The delay-locked loop of claim 18, wherein the first and second phase detector detects a phase difference between the input clock signal and each of the reproduction clock signal and the inverted reproduction clock signal which are alternately input every cycle of the input clock signal.

20. The delay-locked loop of claim 19, wherein the variable delay line comprises:
a plurality of delay cells;
a first register configured to store a position of a delay cell generating the reproduction clock signal among the plurality of delay cells; and
a second register configured to store a position of a delay cell generating the inverted reproduction clock signal among the plurality of delay cells.

21. The delay-locked loop of claim 20, wherein the inversion controller is configured to output the inversion control signal referring to the first and second registers, determine, at an end of coarse locking, which of the delay cell generating the reproduction clock signal and the delay cell generating the inverted reproduction clock signal causes a rising edge of the respective clock signal to be closer to a rising edge of the input clock signal, and controls the received clock signal to be inverted when the delay cell generating the inverted reproduction clock signal causes a rising edge of the inverted reproduction clock signal to be closer to a rising edge of the input clock signal.

22. The delay-locked loop of claim 18, wherein the inversion controller comprises:
a first switch controller configured to output a switch control signal for controlling a switch deciding the inversion or non-inversion of the delayed clock signal; and
a second switch controller configured to control the reproduction clock signal and the inverted reproduction clock signal to be alternately input to the phase detector every cycle of the input clock signal,
wherein the first switch controller determines the inversion or non-inversion of the delayed clock signal based on selection information of the second switch controller at an end of coarse locking.

23. A semiconductor memory device including the delay-locked loop of claim 12, and further comprising:
a memory cell array;
an input terminal configured to receive the input clock signal;
a data output terminal; and
a data output buffer configured to output data, which is read from the memory cell array based on the delayed clock signal, to the data output terminal in synchronization with the input clock signal.

* * * * *